United States Patent [19]
Krökel et al.

[11] Patent Number: 5,574,587
[45] Date of Patent: Nov. 12, 1996

[54] PROCESS FOR INCREASING THE INTERFERENCE SUPPRESSION

[75] Inventors: Dieter Krökel, Lindau; Andreas Schiff, Eriskirch, both of Germany

[73] Assignee: i f m electronic GmbH, Germany

[21] Appl. No.: 283,854

[22] Filed: Aug. 1, 1994

[30] Foreign Application Priority Data

Aug. 2, 1993 [DE] Germany .......................... 43 25 861.1
Sep. 7, 1993 [DE] Germany .......................... 43 30 223.8

[51] Int. Cl.⁶ ................................................. H04B 10/00
[52] U.S. Cl. .......................... 359/153; 359/111; 359/161
[58] Field of Search ........................... 359/111, 117.1 B, 359/161, 187; 340/555, 619

[56] References Cited

U.S. PATENT DOCUMENTS 5,347,529  9/1994  Noe ......................................... 359/187

FOREIGN PATENT DOCUMENTS 35 30 011 C2  9/1987  Germany .
40 34 828 C1  1/1990  Germany .
38 37 591 C2  9/1990  Germany .
41 41 469 A1  6/1993  Germany .

*Primary Examiner*—Leo Boudreau
*Assistant Examiner*—Kinfe-Michael Negash
*Attorney, Agent, or Firm*—Sixbey, Friedman, Leedom & Ferguson, P.C.; David S. Safran

[57] ABSTRACT

A process and a device for increasing interference suppression, especially in optical proximity switches, with an optical transmitter emitting an optical pulse train (1), an optical receiver emitting a measuring signal (2) and a control and evaluation unit controlling the optical transmitter and evaluating measuring signal (2), in which the measuring signal (2) of the optical receiver includes a superposition of a constantly emitted interference background (4) and a measuring pulse (6) emitted when receiving an optical pulse (5), and in which the measuring signal (2) of the optical receiver is evaluated by the control and evaluation unit in a signal interval (8) during a measuring pulse (6) and in at least one background interval (9) outside measuring pulse (6). The increase of the interference suppression is assured in that the evaluation is interrupted by gaps (11, 12) before and after the signal intervals (8) or background intervals (9).

20 Claims, 5 Drawing Sheets

PROCESS FOR INCREASING THE INTERFERENCE SUPPRESSION

BACKGROUND OF THE INVENTION

1. Field of the Invention

The invention relates to a process for increasing the interference suppression, especially in optical proximity switches, with the help of an optical transmitter emitting an optical pulse train, with the help of an optical receiver emitting a measuring signal and with the help of a control and evaluation unit controlling the optical transmitter and evaluating the measuring signal, in which the measuring signal of the optical receiver consists of the superposition of an interference background constantly emitted and a measuring pulse emitted when receiving an optical pulse, and in which the measuring signal of the optical receiver is evaluated by the control and evaluation unit in a signal interval during a measuring pulse and in at least one background interval outside the measuring pulse.

2. Description of Related Art

Optical proximity switches, which operate according to the above-described pulse process, are usually subdivided into three categories. On the one hand, a distinction is made between optical proximity switches, which detect the presence of an object by the absence of optical pulses reflected on a reflector, so-called reflective light barriers, and the optical proximity switches which detect the presence of an object exactly by the reflection of otherwise nonreflected optical pulses on the object to be detected, so-called reflective light sensors. On the other hand, mention is made of optical proximity switches of the so-called one-way light barrier type in which the optical transmitter and the optical receiver are arranged separately, in contrast to the reflective light barrier and reflective light sensor type sensors. In the case of these one-way light barriers, the proof of a close-by object takes place, of course, by the absence of one or more optical pulses, and in this respect, is analogous to the reflective light barrier sensors.

The optical proximity switches known at this time operate mainly according to the so-called pulse process. In this pulse process, the optical transmitter emits a short, intensive light pulse of typically 10 µs to 20 µs length. Then, a pause of, currently, about 500 µs length takes place. To suppress interference, the receiving of further signals is prevented in the case of reflective light sensors and reflective light barriers during the pause between two optical pulses or in the case of one-way light barriers during a part of this pause. This pause is referred to as so-called interference blanking.

The requirements on modem optical proximity switches now essentially are to assure a higher operating frequency with constant or even increased sensitivity..

To meet these requirements, various processes for increasing the interference suppression have been proposed, for example, see German Patent No. 35 30 011. The causes of the interference background superimposed on the measuring signal can be of diverse nature. On the one hand, interference of outside light is produced and in this case is coupled by the optical receiver in the optical proximity switches. But other effects can also play a role, e.g., starting pulses of other devices, alternating-current hums or similar effects, which then are launched capacitively, inductively or galvanically in the electronic structure of the optical proximity switch.

Especially low-frequency interference has a high portion because of the known 1/f-decrease in the noise spectrum. A suppression of this interference would be possible only with averaging times that have a significantly lower time constant than the interference itself. Such an averaging would thus be connected with an extreme reduction of the operating frequency of the optical proximity switch, which, of course, is not desired.

The above-mentioned German Patent 35 30 011 discloses a process for increasing the interference suppression. In this process, especially the effects of stray light are offset. For this purpose, the stray light signal present at the time is stored shortly before the occurrence of each measuring pulse. When the measuring pulse occurs, the signal present at the time and consisting of the stray light signal and measuring pulse is then again stored. The intensity of the actual measuring pulse is then obtained in that the stored signals are subtracted from one another.

This process has some considerable deficiencies. On the one hand, because of the short successive measurements for an input amplifier stage of the optical proximity switch, a high band width is required, which again makes the optical proximity switch sensitive to high frequency interference, such as starting pulses or radio interference. On the other hand, the process described in German Patent 35 30 011 is not suitable for use in one-way light barriers, since there a synchronization of the receiving of the interference background to the measuring pulse is very expensive. Further, systematic spurious components in the interference background increasingly occur exactly near the optical pulses or the measuring pulses, which are caused in the operating pulse for emitting the optical pulse.

SUMMARY OF THE INVENTION

The primary object of this invention, thus, is to further develop the process for increasing interference suppression, so that the operating frequency and/or the sensitivity of the known optical proximity switches are increased.

This object is achieved in accordance with the invention by interrupting the evaluation before and after the signal intervals or the background intervals by gaps.

The thus described process according to the invention entails various advantages. On the one hand, the addressed wide-band property of the input amplifier stage of the optical proximity switch is largely reduced, since the measurements in the signal interval and the background interval follow one another only at a marked interval. On the other hand, by the suitable selection of the length of the gaps, it is possible to place the background interval in a range of the measuring signal with small systematic interference background. Another decisive advantage consists in the fact that the process according to the invention can also be used with only small modifications in one-way light barriers.

A suitable device for implementing the process according to the invention to increase the interference suppression comprises a control and evaluation unit made of a microcontroller with an integrated or coupled analog/digital converter. All described process features can be implemented in an especially suitable way with such an arrangement.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENT

Figure 1:
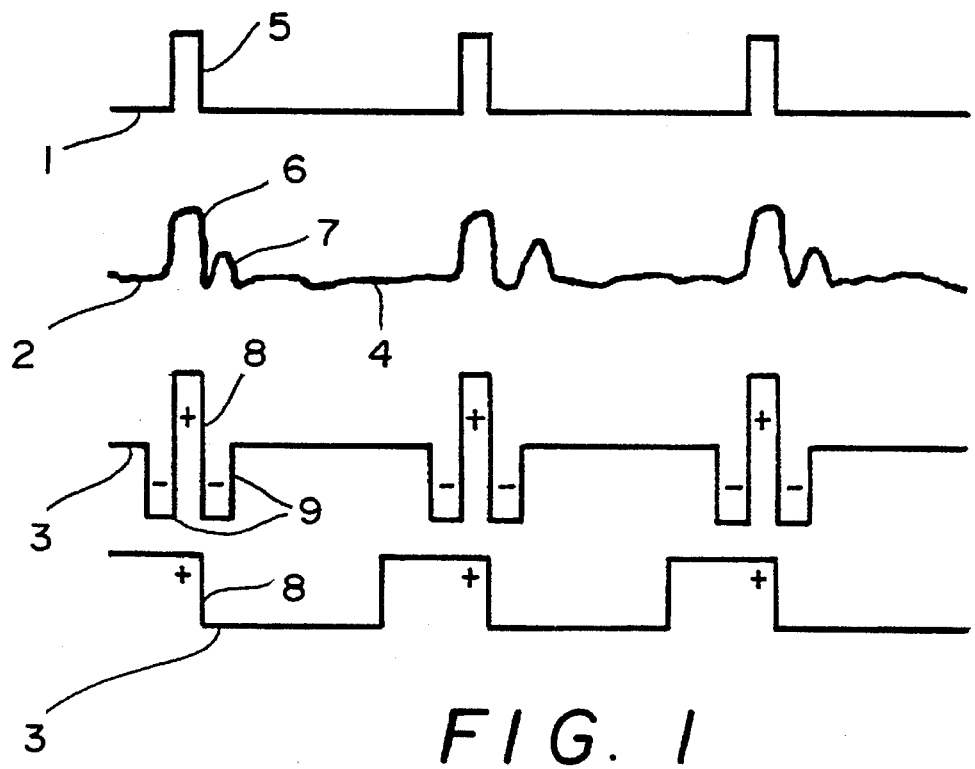
FIG. 1 graphically depicts the transmitting, measuring and evaluating operations of a process known from the prior art.

In FIG. 1, the known process for increasing the interference suppression according to German Patent No. 35 30 011 for reflective light barriers or reflective light sensors and also a known process for use in one-way light barriers is represented in the form of graphs of transmitting, measuring and evaluating operations. In FIG. 1, the first graph represents an optical pulse train 1 of the optical transmitter. The second graph shows a measuring signal 2, as it is delivered from an optical receiver. This measuring signal 2 is then evaluated, as represented as evaluation plot 3 depicted in the third graph, in a control and evaluation unit, which simultaneously controls the optical transmitter. As is easily seen, measuring pulses 6 corresponding to optical pulses 5 are found in measuring signal 2 of the optical receiver in addition to a constantly present interference background 4. Interference background 4 also has systematic interference pulses 7 in addition to statistical effects. These interference pulses 7 are represented in FIG. 1 in direct proximity to the measuring pulses 6, in which it corresponds to an empirical fact that the emitting or the receiving of the optical pulses often entails an electronic interference with a certain time delay. After the evaluation operation 3 of the known process, interference background 4 is subtracted in the immediate vicinity of measuring pulse 6 from this very measuring pulse 6. For this purpose, measuring signal 2 is stored during measuring pulse 6 in a signal interval 8 and interference background 4 is stored respectively in advance and afterwards during a background interval 9. The "+" and "−" symbols respectively symbolize an integration of the values stored during signal intervals 8 and background intervals 9 over several periods of optical pulse train 1. Based on this evaluation operation 3 represented in FIG. 1, the already-mentioned problems of the known process for increasing the interference suppression clearly come to light. It is especially understandable in this case that the measuring accuracy and thus, for example, also the operating frequency negatively influence interference pulse 7 frequently occurring in the vicinity of measuring pulses 6. Based on the synchronization, that cannot be achieved, of signal intervals 8 with background intervals 9 in the case of one-way light barriers, the known processes for increasing the interference suppression, in the case of one-way light barriers, an evaluation operation 3 according to the fourth graph in FIG. 1 results. In this case, measuring signal 2 is picked up and evaluated already before the receiving of optical pulse 5 and the associated measuring pulse 6. Signal intervals 8 therefore comprise portions of interference background 4 in connection with measuring pulses 6 in a ratio that cannot be determined exactly. Interference background 4 cannot be eliminated with this known process for one-way light barriers.

Figure 2:
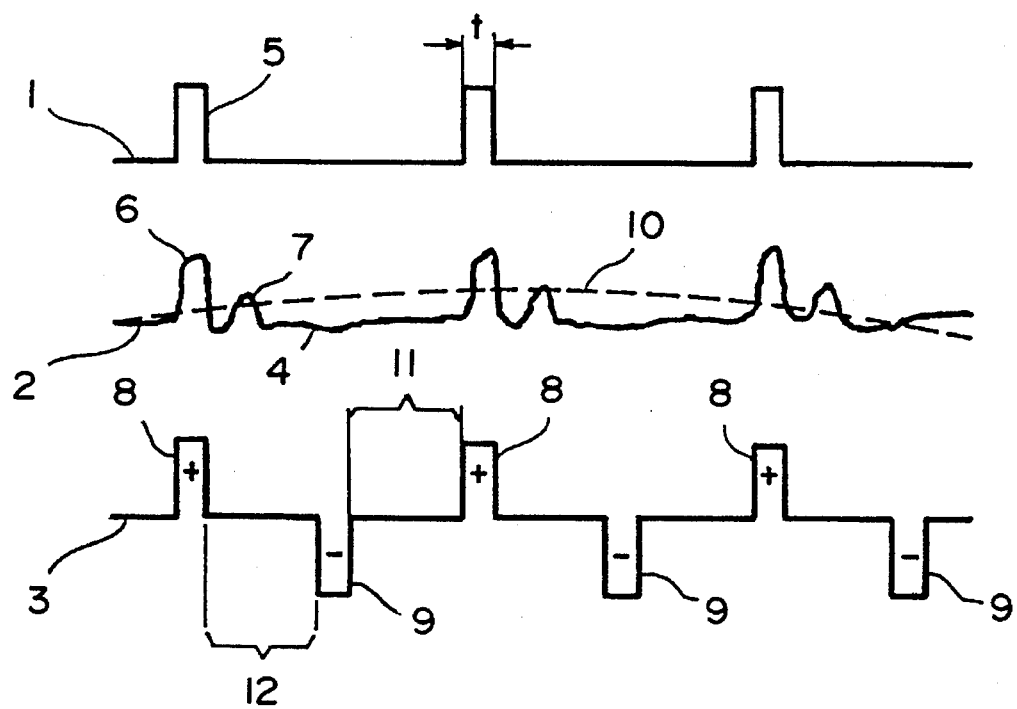
FIG. 2 graphically depicts the transmitting, measuring and evaluating operations of a process according to the invention, especially for reflective light barriers.

In FIG. 2, the process for increasing the interference suppression according to the invention is now represented based on its transmitting, measuring and evaluating operations. Optical pulse train 1 corresponds to the optical pulse train with optical pulses 5 known from the prior art. Measuring signal 2 thus also corresponds to measuring signal 2, already represented in FIG. 1, with constantly present interference background 4, measuring pulses 6 and interference pulses 7. Further, a low-frequency background portion 10 can also be superimposed to measuring signal 2, e.g., by alternating-current hums. In this FIG. 2, the low-frequency background portion 10 must be imagined as superimposed in addition to measuring signal 2. Finally, from the evaluation 3 according to the invention as represented in the third graph in FIG. 2, it becomes clear that the evaluation is interrupted by gaps 11, 12 before and after the signal intervals 8 or the background intervals 9. The gaps 11, 12 represented in FIG. 2 exhibit the same length, but this is not a requirement. Depending on the section of measuring signal 2 in which a systematic interference background is present, the position of background interval 9 is changed by corresponding selection of the lengths of gaps 11, 12.

Figure 3:
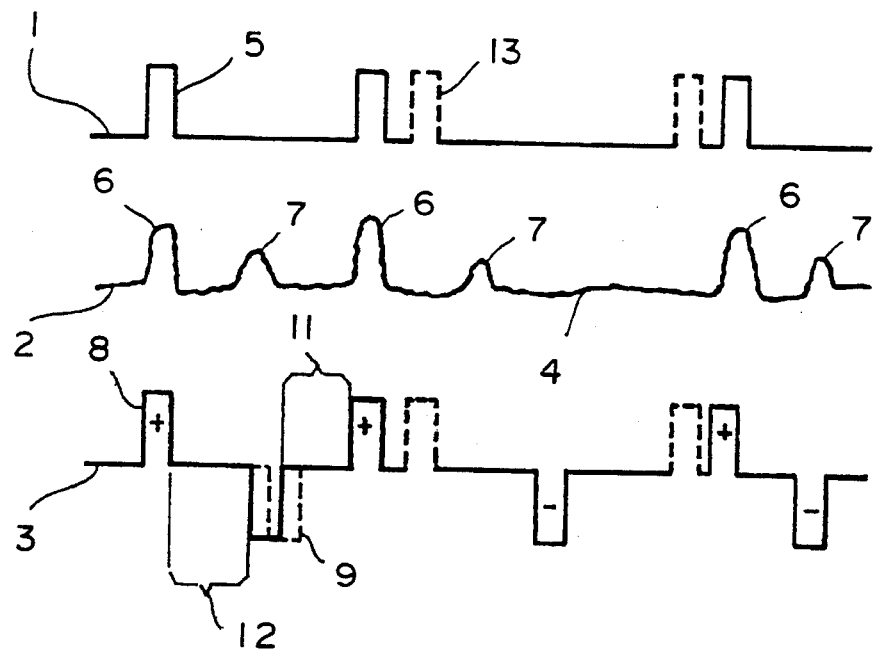
FIG. 3 graphically depicts the transmitting, measuring and evaluating operations of a modified form of the process according to the invention.

Since it is often not possible in the production process of the optical proximity switch to determine in advance the position of a systematic interference background, it is proposed, according to the invention, to vary the pulse frequency of optical pulse train 1 in a preset range, preferably by approximately 10 to 20%, by an average pulse frequency. Such a variation of the pulse frequency connected with a corresponding lengthening or shortening of gaps 11, 12 is represented in FIG. 3 of the drawing. The pulses 13, represented there as a broken line, symbolize the emitting of an optical pulse at an unchanged pulse frequency. Corresponding to the variation of the pulse frequency, the position of measuring pulses 6 and of interference pulses 7, which, for clarification, have a position different than in FIGS. 1 and 2, in the example shown here for a measuring signal, changes in measuring signal 2. As is clearly shown based on the evaluation graph 3, interference pulses 7 partially coincide with background intervals 9, but this happens only in a fraction of the cases considered. As a result of the variation of the pulse frequency, systematic interference pulses 7 in any case enter only partially in the measuring result. Analogously, a lock-in process is used at some points with the process according to the invention, by which it is meant that the interference sensitivity in the case of the pulse frequency and multiples of it is reduced, while it is increased somewhat instead in the case of the adjacent frequencies.

The simplest variation now consists in systematically varying the pulse frequency, thus continuously tuning it, for example. But, if all possible systematic interference pulses 7 are desired to be eliminated insofar as possible, an unsystematic or random variation of the pulse frequency can be performed.

Figure 4:
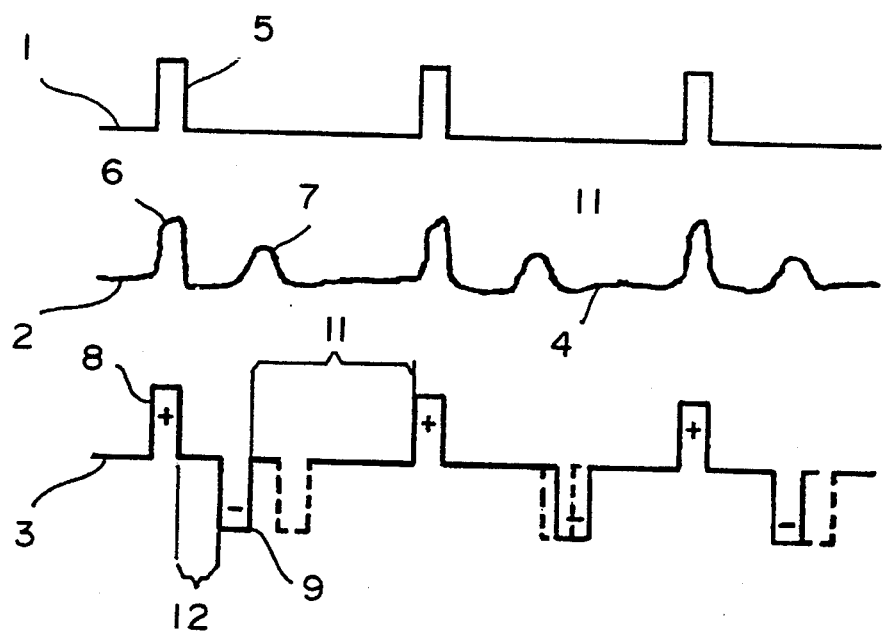
FIG. 4 graphically depicts the transmitting, measuring and evaluating operations of a second modified form of the process according to the invention.

As an alternative or cumulatively, a variation of gaps 11, 12 in a preset range can be achieved in addition to a variation of the pulse frequency of the optical pulse train. FIG. 4 represents such a variation of the gaps 11, 12 without a simultaneous variation of the pulse frequency. The result of a variation of gaps 11, 12 is essentially identical with the variation of the pulse frequency with respect to the interference suppression. But, other essential properties of the optical proximity switch remain intact in the case of a variation of gaps 11, 12, such as, e.g., the maximum operating frequency, which change with a variation of the pulse frequency.

Gaps 11, 12 can be varied systematically or unsystematically, thus randomly, just like the pulse frequency.

The embodiments of a process according to the invention previously represented in FIG. 1 to 4 are jointly characterized in that the length of optical pulse 5 is selected to be significantly smaller than the length of the pauses between optical pulses 5. In such a process for interference suppression, it is especially advantageous if the pulse frequency of optical pulse train 1 is increased in comparison to the usual pulse process, preferably to approximately 5 kHz. To maintain simultaneously the overall transmitting power, the transmitting current for the optical transmitter is reduced analogously to the increase of the pulse frequency. By the selection of a high pulse frequency, the tuning of a high-pass filter, which filters the measuring signal, can take place, so that the interference background, which is especially great because of the 1/f-decrease in the noise spectrum at low frequencies, cf. the low-frequency background portion 10 in FIG. 2, is already greatly reduced by the control and evaluation unit before the receiving of measuring signal 1.

Of course, the process according to the invention, as usual also with the lock-in process used, can be operated with a square-wave modulation, i.e., the length of optical pulses 5 corresponds in this case essentially to the length of the pauses between optical pulses 5. Such a square-wave modulation has the advantage that the band-width requirement on the electronics is smaller than in the case of the modulation with short pulses. Moreover, relatively narrow-band filters can be used, so that interferences of higher frequencies are also better blocked.

In the previously described process with short pulses, the pulse frequency is limited by the evaluating time of the control and evaluation unit and cannot be increased without considerable expense. It is therefore useful to determine analogous measuring signal 2 before the evaluation by the control and evaluation unit with the help of a low-pass filter. In this case, the time constant of the low-pass filter is selected essentially corresponding to the length of optical pulses 5 or the length of the pauses between optical pulses 5.

Figure 5:
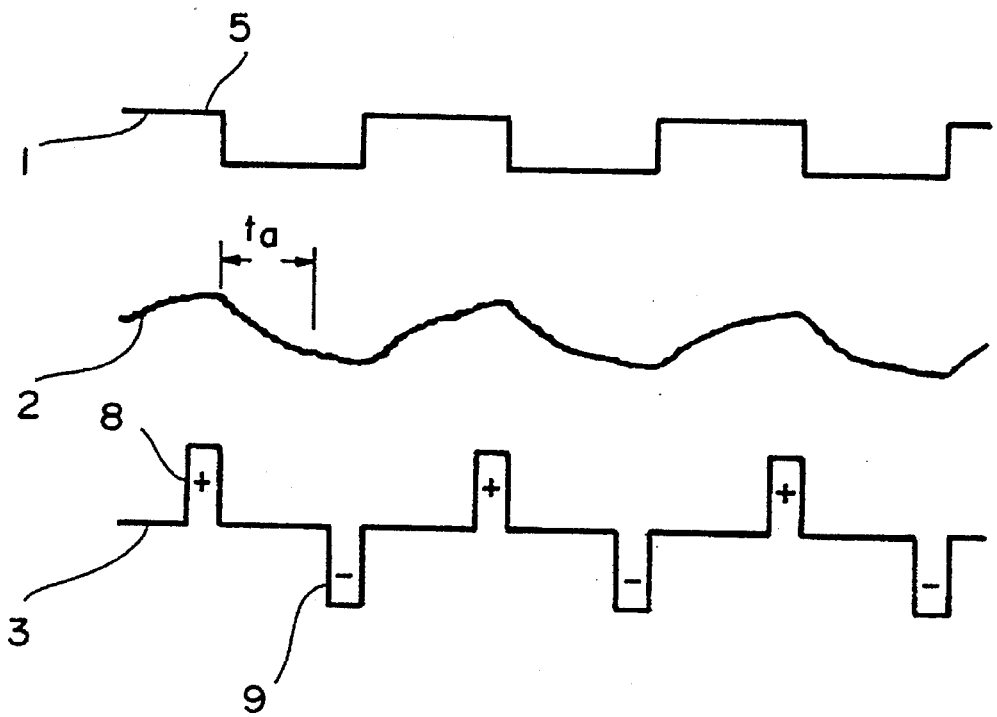
FIG. 5 graphically depicts the transmitting, measuring and evaluating operations of a third modified form of the process according to the present invention.

The square-wave modulation of optical pulse train 1 is represented in FIG. 5, it is clearly shown that the length of optical pulses 5 corresponds to the length of the pauses between optical pulses 5. Measuring signal 2 is represented in FIG. 5 after the filtering through the low-pass filter. It is clearly shown that measuring signal 2 has risen to its maximum value or dropped to its minimum value at the end of optical pulse 5 or of the pause between optical pulses 5. The indicated time interval $t_a$ in FIG. 5 corresponds approximately to the time constant of the low-pass filter. To achieve the desired relief of the control and evaluation unit, the signal intervals 8 and background intervals 9 are first opened respectively at the end of optical pulses 5 or of the pauses between optical pulses 5. In this case, the length of signal intervals 8 and the length of background intervals 9 is selected to be small relative to the length of optical pulses 5 or of the pauses between optical pulses 5.

Figure 6:
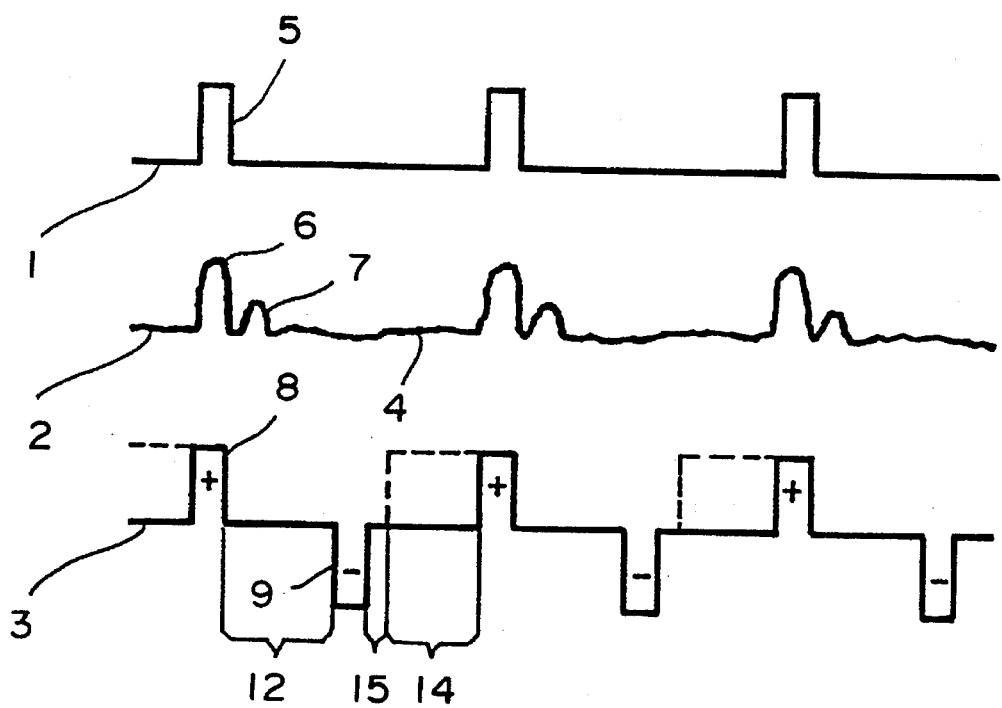
FIG. 6 graphically depicts the transmitting, measuring and evaluating operations of a process according to the invention, especially for one-way light barriers.

In FIG. 6, the transmitting, measuring and evaluating operations for an arrangement with an optical receiver separated from the optical transmitter, thus a one-way light barrier, is further represented. Optical pulses 5 of optical pulse train 1 are emitted with a length substantially smaller than the length of the pauses between optical pulses 5 in this further embodiment of the process according to the invention. Measuring signal 2, again, comprises, as already described, measuring pulses 6, interference pulses 7 and a constantly present interference background 4. The synchronization problems in the case of one-way light barriers between the emitting of optical pulses 5 and the evaluation of measuring signal 2 is achieved according to the invention in that signal interval 8 is opened by the increase of measuring signal 2 within a trigger interval 14. After the closing of the signal interval, background interval 9 is opened after a preset gap 12. After the closing of background interval 9, trigger interval 14 is again opened after another gap 15. With this described course of the process, it is possible to achieve an increase of the interference suppression also in the case of one-way light barriers. In contrast to the known process, the interference background can now be determined and thus eliminated also in the case of one-way light barriers.

Figure 7:
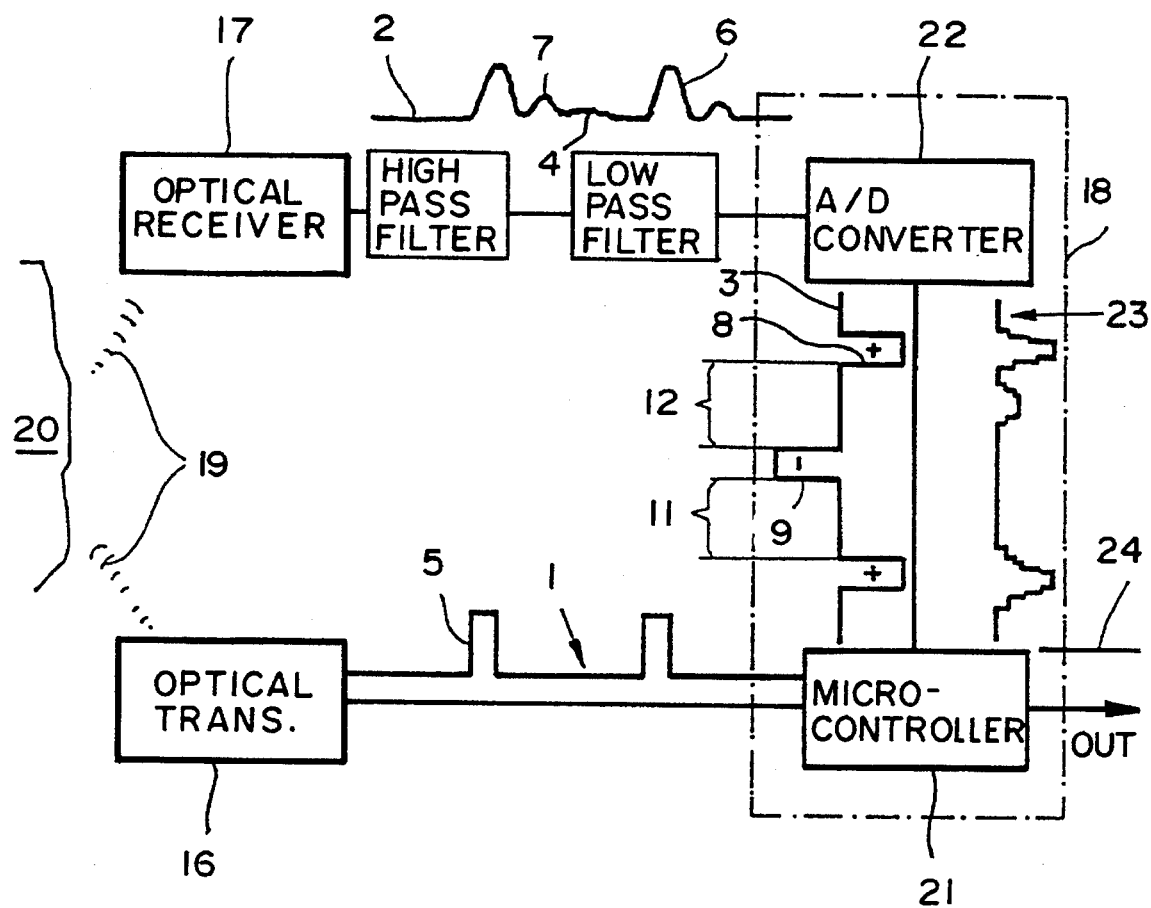
FIG. 7 is a block diagram of a device for implementing the transmitting, measuring and evaluating operations of a reflective light sensor according to a process of the invention.

A device for implementing one of the above-described processes, here especially for a reflective light sensor, is shown in FIG. 7. This device comprises an optical transmitter 16 emitting an optical pulse train 1, an optical receiver 17 emitting a measuring signal 2 and a control and evaluation unit 18 controlling optical transmitter 16 and evaluating measuring signal 2. Further represented are actual optical pulses 19, which, because of the control pulses thus far always not quite consistently designated as optical pulses 5, are emitted for actual optical pulses 19. Measuring signal 2 of optical receiver 17, comprised of the superposition of a constantly emitting interference background 4, of the interference pulses 7 and of a measuring pulse 6 emitting, when receiving an actual optical pulse 19 reflected on a response element 20, is now attained at the input of control and evaluation unit 18. Measuring signal 2 of the optical receiver 17 is evaluated by this control and evaluation unit 18 in a signal interval 8 during a measuring pulse 6 and in at least one background interval 9 outside measuring pulse 6. Control and evaluation unit 18 is characterized especially advantageously in that it is comprised of a microcontroller 21 with integrated or coupled analog/digital converter 22. In this case, analog/digital converter 22 transforms measuring signal 2 to a digital signal 23, which then is evaluated by microcontroller 21 in accordance with a process according to the invention, i.e., with gaps in the evaluation before and after at least one of the signal intervals and the background intervals. Microcontroller 21 then delivers an output signal 24, which, depending on whether the optical proximity switch is designed as an "opener" which delivers a voltage with a certain value, or as a "closer" which does not deliver any voltage, upon a detection of the measuring pulses. The reflective light sensors represented here are distinguished only by a reflective light barrier in the respect that in a reflective light barrier, actual optical pulses 19 are reflected constantly to a reflector provided for this purpose, in which this reflection is interrupted by a corresponding response element.

Figure 8:
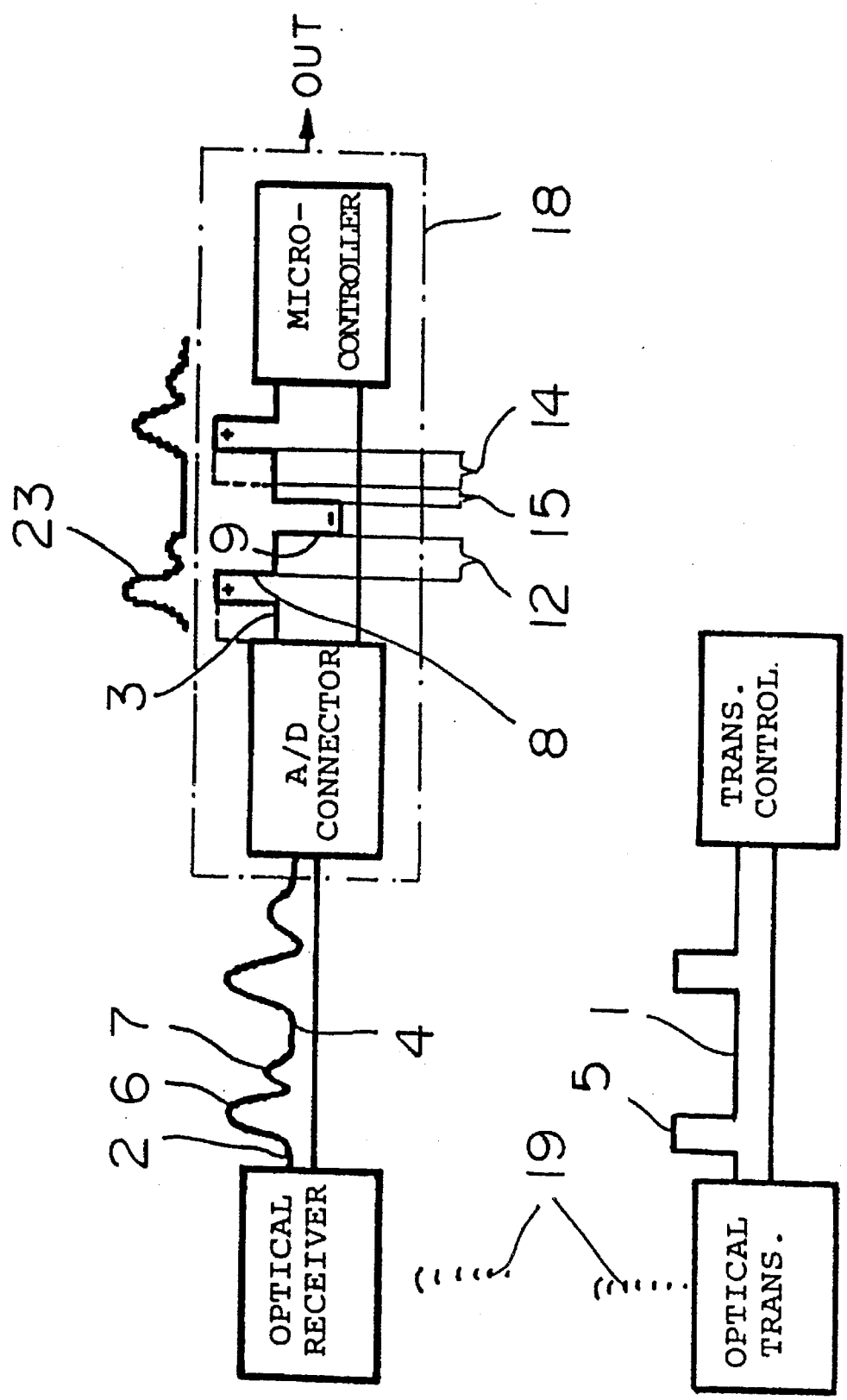
FIG. 8 is a block diagram of a device for implementing the transmitting, measuring and evaluating operations of a one-way light barrier according to a process of the invention.

Another device for implementing one of the above-described processes, namely here especially for a one-way light barrier, is shown in FIG. 8. The reference numbers used in FIG. 8 correspond as far as possible to the already introduced reference numbers. The essential difference between a one-way light barrier and a reflective light barrier lies in the fact that control and evaluation unit 18 is arranged galvanically separately from transmitter control 25 forming a component of the control and evaluation unit 18 in a reflective light barrier. The already described synchronization problem between the emitting of optical pulses 5 and the evaluation of measuring signal 2 follows from the above. The course of transmitting, measuring and evaluating is correspondingly represented in FIG. 8, which according to the invention solves this synchronization problem and in connection therewith assures an increase of the interference suppression.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

We claim:

1. A process for increasing interference suppression in optical proximity switches utilizing an optical transmitter emitting an optical pulse train, an optical receiver emitting a measuring signal, and with a control and evaluation unit controlling the optical transmitter and evaluating measuring signal, in which the measuring signal of the optical receiver is comprised of a superposition of a constantly emitted interference background and a measuring pulse emitted when receiving an optical pulse, and in which the measuring signal of the optical receiver is evaluated by the control and evaluation unit in a signal interval during a measuring pulse and in at least one background interval outside the measuring pulse; wherein the evaluation is interrupted by gaps between the signal intervals and the background intervals.

2. A process according to claim 1, wherein the pulse frequency of the optical pulse train is varied by an average pulse frequency in a preset range.

3. A process according to claim 2, wherein the preset range is approximately 10 to 20%.

4. A process according to claim 2, wherein the pulse frequency is varied systematically.

5. A process according to claim 2, wherein the pulse frequency is varied randomly.

6. A process according to claim 1, wherein the gaps are varied in a preset range.

7. A process according to claim 6, wherein the gaps are varied systematically.

8. A process according to claim 6, wherein the gaps are varied randomly.

9. A process according to claim 1, wherein the length of the optical pulses is selected to be substantially smaller than the length of pauses between optical pulses.

10. A process according to claim 9, wherein the pulse frequency of optical pulse train is approximately 5 kHz.

11. A process according to claim 9, wherein the measuring signal is filtered through at least one high-pass filter.

12. A process according to claim 1, wherein the length of the optical pulse is selected to essentially correspond to the length of pauses between optical pulses.

13. A process according to claim 12, wherein the measuring signal is averaged with a low-pass filter.

14. A process according to claim 13, wherein a time constant of the low-pass filter is selected to essentially correspond to the length of at least one of the optical pulses and the pauses between the optical pulses.

15. A process according to claim 14, wherein the signal intervals and background intervals are commenced at one of the end of the optical pulses and the end of the pauses between the optical pulses.

16. A process according to claim 15, wherein the length of the signal intervals and the length of the background intervals are selected to be small relative to the one of the length of the optical pulses and the length of the pauses between optical pulses.

17. Process according to claim 9, wherein the signal interval is commenced by an increase of the measuring signal within a trigger interval.

18. Process according to claim 17, wherein the trigger interval is commenced after the background interval.

19. A device for increasing interference suppression in optical proximity switches comprising an optical transmitter for emitting an optical pulse train, an optical receiver for emitting a measuring signal comprised of a superposition of a constantly emitted interference background and a measuring pulse emitted when receiving an optical pulse, and a control and evaluation unit for controlling said optical transmitter and for evaluating the measuring signal in a signal interval during a measuring pulse and in at least one background interval outside of the measuring pulse with an interruption of the evaluation with gaps between the signal intervals and the background intervals; wherein the control and evaluation unit comprises a microcontroller connected with the optical receiver via an analog/digital converter.

20. A device for increasing interference suppression in optical proximity switches according to claim 19, wherein the control and evaluation unit is arranged galvanically separately from a transmitter control forming a component of the control and evaluation unit for use with a one-way light barrier type optical proximity switches.

* * * * *